United States Patent
Grosser et al.

[19]

[11] Patent Number: 6,118,667
[45] Date of Patent: Sep. 12, 2000

[54] CARD INSULATOR AND GUIDE FOR A COMPUTER SYSTEM HAVING HOT PLUGABLE ADAPTER CARDS

[75] Inventors: Cynthia M. Grosser; Mohanlal Savji Mansuria, both of Apex; Leo Harold Webster, Jr., Cary, all of N.C.

[73] Assignee: International Business Machines Corporation, Armonk, N.Y.

[21] Appl. No.: 09/176,997

[22] Filed: Oct. 22, 1998

[51] Int. Cl.[7] ....................................................... H05K 9/00
[52] U.S. Cl. .......................... 361/752; 361/683; 361/687; 361/688; 361/736; 361/752; 361/801; 361/825; 439/64; 439/37
[58] Field of Search ..................................... 361/736, 801, 361/818, 825, 683, 687, 688, 788; 439/64, 377

[56] References Cited

U.S. PATENT DOCUMENTS

| | | | |
|---|---|---|---|
| 4,550,362 | 10/1985 | Reimer | 361/801 |
| 4,669,030 | 5/1987 | Bannister | 361/736 |
| 4,872,212 | 10/1989 | Roos et al. | 361/818 |
| 4,964,017 | 10/1990 | Jimdrick et al. | 361/683 |
| 5,157,590 | 10/1992 | Barthel et al. | 361/825 |
| 5,162,978 | 11/1992 | Vogt et al. | 361/785 |
| 5,590,023 | 12/1996 | Hernandez et al. | 361/683 |
| 5,617,299 | 4/1997 | Knoop et al. | 361/788 |

*Primary Examiner*—Jeffrey Gaffin
*Assistant Examiner*—Tuan Dinh
*Attorney, Agent, or Firm*—Martin J. McKinley

[57] ABSTRACT

A removable card insulator and guide prevents inadvertent shorting during the insertion or removal of an adapter card into a "hot-plug" computer system. The card insulator includes perpendicular first and second planar portions. When installed in a computer system, the first planar portion is positioned perpendicular to the motherboard, and the second planar portion is positioned parallel to the motherboard such that any components on the motherboard are positioned between the second planar portion and the motherboard. The second planar portion includes a slot through which an adapter card connector can be passed to mate with a connector on the motherboard. A step has perpendicular riser and tread portions, wherein the riser is attached perpendicular to the second planar portion, such that the tread is parallel to and offset from the second planar portion. When installed in the computer system, the tread is closer to the motherboard than the second planar portion and provides protection against the inadvertent shorting of an adapter card bracket to the motherboard. The opposing edges of the card insulator are inserted into guides attached to opposing walls of the computer system.

5 Claims, 2 Drawing Sheets

CARD INSULATOR AND GUIDE FOR A COMPUTER SYSTEM HAVING HOT PLUGABLE ADAPTER CARDS

BACKGROUND OF THE INVENTION

This invention pertains to computer and other information handling systems wherein "option cards" or "adapter cards" can be plugged into and removed from the system without turning the power to the system OFF, and, more particularly, to an improved mechanical card insulator and guide that prevents accidental shorting during the insertion or removal of an adapter card.

Computer systems usually have a main printed circuit board commonly called the "motherboard." The motherboard is usually equipped with a plurality of card edge connectors for receiving adapter cards. These adapter cards are designed to provide optional and additional functions that the base system on the motherboard does not provide. In many computer systems, the insertion or the removal of an adapter card requires that the power to the system be turned OFF. In more advanced systems, adapter cards can be plugged into and unplugged from the system while the power to the system is ON. Plugging an adapter card into or removing it from a system while the power is ON is generally referred to as "hot-plugging."

Since most adapter cards have a metal bracket at one edge of the card, and because the power to the motherboard is not turned OFF in a "hot-plug" system during insertion or removal of an adapter card, the accidental contact of the metal bracket to the motherboard can result in an electrical short. In addition, during insertion or removal of an adapter card, the accidental contact of an adapter card to an adjacent adapter card already installed in the system can also result in an electrical short. Furthermore, accidental shorting can also result from small metallic items, such as nuts, bolts, screwdrivers, pens and pencils, being accidentally dropped on a "live" motherboard when the system housing has been opened to insert or remove an adapter card.

To overcome these problems, at least two solutions have been used in the past. In the first solution, the motherboard is covered with a "motherboard insulator," which is comprised of a large sheet of semi-rigid or rigid plastic. The adapter card connectors on the motherboard are accessible to the edge connector of an adapter card through a plurality of slots in the motherboard insulator. Positioned between each of these slots in the motherboard insulator is a mechanical connector. A substantially rectangular card insulator, which is comprised of a thin sheet of semi-rigid or rigid plastic, is positioned between two adjacent adapter cards and attached to the mechanical connector on the motherboard insulator such that the card insulator is supported in a position substantially perpendicular to the motherboard and the motherboard insulator.

In the second solution, the motherboard insulator is comprised of a pliable sheet of plastic that covers the motherboard. The card insulators are inserted between the adapter cards, but are not attached to the motherboard insulator as in the first solution. Instead, each of the two opposite vertical edges of a card insulator are held by plastics guides, which are attached to the frame of the computer system.

There are a number of problems and disadvantages to each of these prior art solutions. One disadvantage to both solutions is that the entire motherboard is covered with a plastic sheet, thereby effecting cooling by reducing the air flow over the motherboard. It would also be desirable if the motherboard insulator could be eliminated entirely, thereby reducing the cost of protecting the system from inadvertent electrical shorts. In the first solution, the insulator connectors usually tightly bind the card insulators, thereby making it difficult to remove an individual card insulator. Furthermore, while the entire assembly of motherboard insulator and card insulators can be removed, this requires that all adapter cards be removed first. In this respect, the second solution is better, because it permits the easy insertion and removal of individual card insulators.

Accordingly, the invention described below overcomes many of the disadvantages of the prior art solutions by eliminating the motherboard insulator, while still providing protection against electrical shorts during insertion and removal of adapter cards, as well as providing protection against shorts caused by the inadvertent dropping of small metallic parts over the motherboard.

SUMMARY OF THE INVENTION

Briefly, the invention is an information processing system including a housing having first, second and third sides, wherein the first and second sides are substantially perpendicular to the third side, and the first side opposes the second side. A motherboard is coupled to the third side of the housing and includes a first connector for receiving an adapter card. A plurality of components are attached to the motherboard. An adapter card includes a second connector that is coupled to the first connector of the motherboard. A card insulator includes a first planar portion with opposing first and second edges, and a second planar portion coupled to the first planar portion and extending substantially perpendicular to the first planar portion. The second planar portion has a slot through which the first and second connectors can be coupled together. A step includes substantially perpendicular riser and tread portions. The riser portion is coupled to and extends substantially perpendicular to the second planar portion, and the tread portion is positioned substantially parallel to and offset from the second planar portion. First and second guides are coupled, respectively, to the first and second sides of the housing. The first and second edges of the card insulator are positioned, respectively, in the first and second guides such that the first planar portion of the card insulator is positioned substantially perpendicular to the motherboard, and such that the second planar portion is positioned substantially parallel to the motherboard wherein the components are positioned between the second planar portion and the motherboard. In addition to the guides, other means for supporting the card insulator are also described.

In another embodiment, the invention is a card insulator for use with an information processing system including a motherboard having a first connector for receiving an adapter card, a plurality of components coupled to the motherboard, and an adapter card having a second connector coupled to the first connector of the motherboard.

The card insulator includes a first planar portion and a second planar portion coupled to the first planar portion and extending substantially perpendicular to the first planar portion. The second planar portion has a slot through which the first and second connectors can be coupled together. When the card insulator is installed in the information processing system, the first planar portion of the card insulator is positioned substantially perpendicular to the motherboard, the second planar portion is positioned substantially parallel to the motherboard, and the components are positioned between the second planar portion and the motherboard.

Description of a Preferred Embodiment

Figure 1:
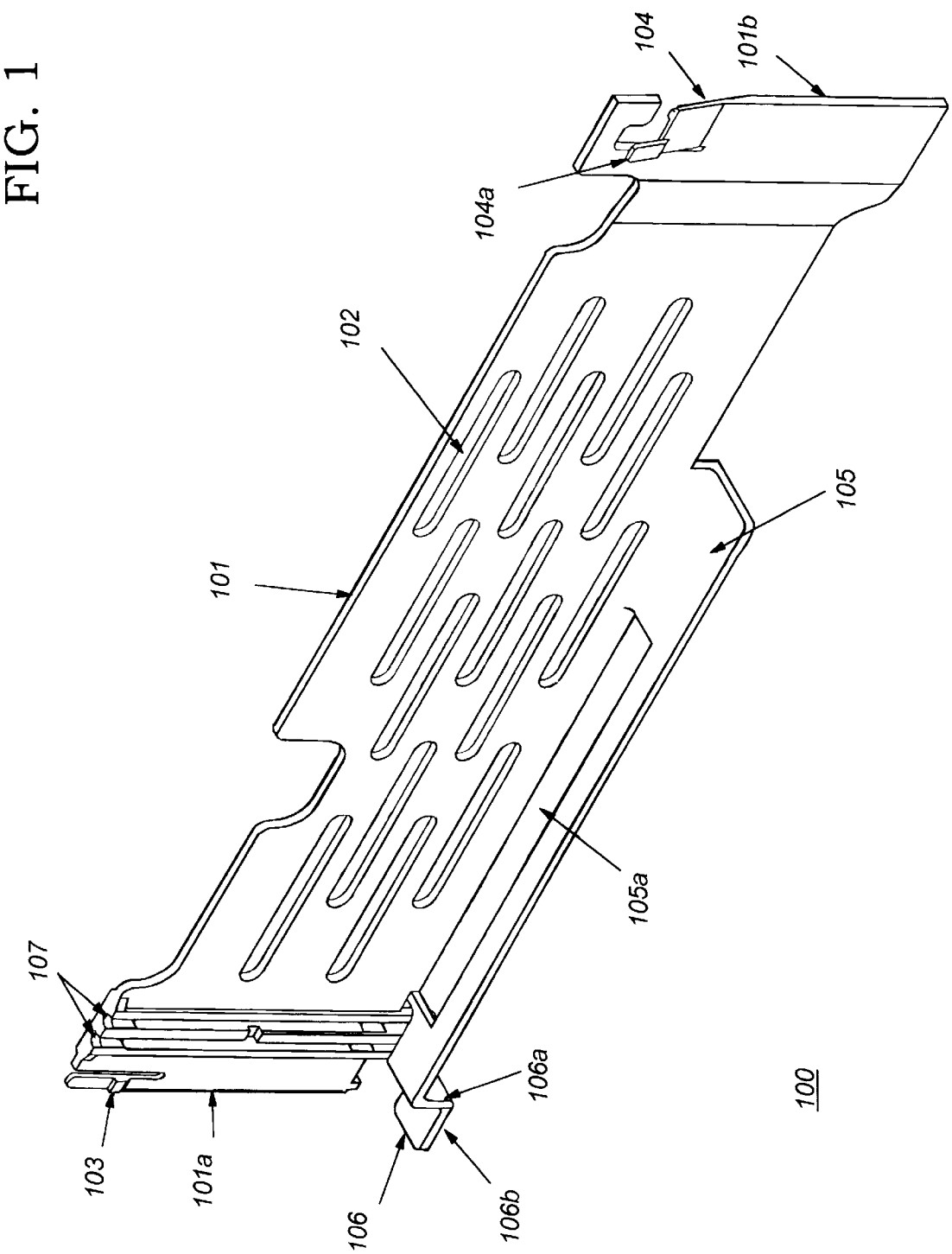
FIG. 1 is an elevational view of the card insulator and guide.

FIG. 1 is an isometric view of the card insulator of the present invention. Referring to this figure, card insulator 100 includes a first planar portion 101 having a plurality of slots 102. When installed in a computer system, slots 102 permit air flow through the card insulator 100, thereby facilitating cooling. First planar portion 101 includes first and second opposing edges 101a and 101b. First planar portion 101 also includes cantilever springs 103 and 104, each of which includes a locking tab, for example, tab 104a. A second planar portion 105 having a slot 105a is connected to first planar portion 101 and extends substantially perpendicular to the first planar portion. Step 106 includes a riser portion 106a, which is substantially perpendicular to a tread portion 106b. Riser 106a is connected to second planar portion 105 and extends substantially perpendicular to the second planar potion, while tread 106b is substantially parallel to and offset from the second planar portion. Two light pipes 107 are installed in grooves in first planar portion 101. Card insulator 100 is preferably injection molded using a blend of polycarbonate and ABS plastic materials, although other insulating materials may be used.

Figure 2:
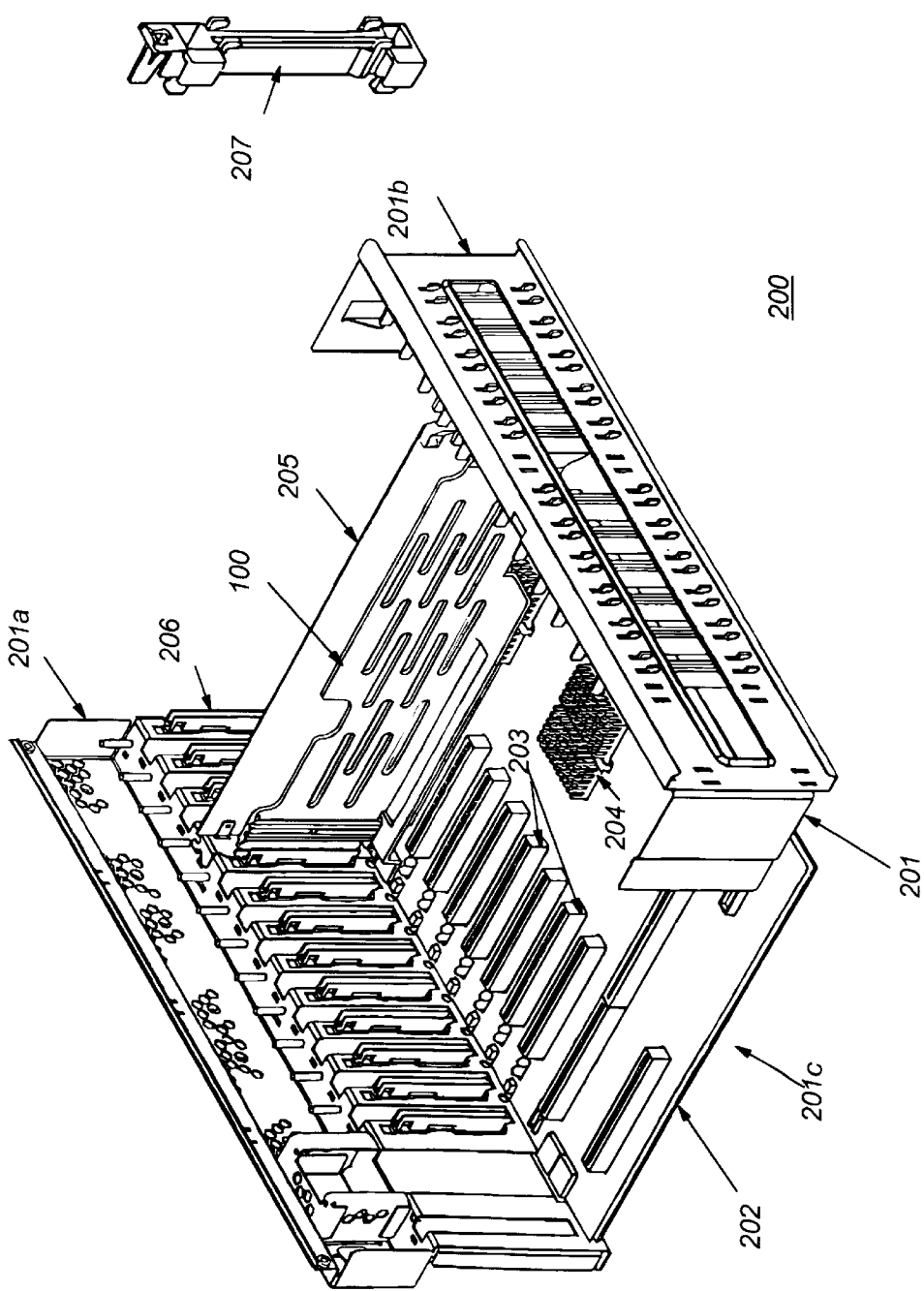
FIG. 2 is an exploded isometric view of a computer system of the present invention.

FIG. 2 is an isometric view of a computer system or other information processing system 200 into which card insulator 100 has been installed. Referring to this figure, computer system 200 includes a housing 201 having first, second and third sides 201a, 201b and 201c, respectively. A motherboard 202 having well known electrical connectors 203 and components 204 is attached to third side 201c of housing 201. A well-known card/card insulator guide 206 is attached to first side 201a of computer housing 201, and supports edge 101a of card insulator 100, as well as an edge of adapter card 205. A second card insulator guide 207 (illustrated in FIG. 2 "exploded" from housing 201) is attached to the second side 201b of housing 201 and receives the opposing edge 101b of card insulator 100. Cantilever spring 104 and tab 104a lock card insulator 100 into guide 207. In a similar fashion, cantilever spring 103 and its associated tab lock the opposite end of card insulator 100 into guide 206. With a plurality of card insulators 100 installed in computer system 200, adapter cards (e.g., adapter card 205) can be easily inserted into the computer because the card insulators guide the adapter card into the slot defined by the corresponding connector 203 and prevent one adapter card from electrically shorting to an adjacent adapter card.

Other means, besides guides 206 and 207, can also be used to support card insulator 100. For example, card insulator 100 could be supported by way of pins or tabs that extend down from the bottom edge of the card insulator and mate with corresponding receptacles on or in motherboard 202. The disadvantage to this method of supporting card insulator 100 is that it increases the complexity of the motherboard by requiring the addition of receptacles for receiving the mating pins or tabs on the card insulator. In the alternative, card insulator 100 could also be attached to adapter card 205 by clips or any other suitable means of attachment. The disadvantage to attaching card insulator 100 to the adjacent adapter card 205 is that the adapter card cannot be removed without first removing the card insulator or, at least, first removing the clips that attach the card insulator to the adapter card.

A well-known adapter card 205 having a well known mating connector (not visible in FIG. 2) is coupled to an appropriate one of connectors 203 of motherboard 202 through slot 105a of card insulator 100. With card insulator 100 installed, second planar portion 105 is positioned parallel to and offset from motherboard 202, thereby positioning components 204 between the motherboard and the second planar portion. The positioning of the second planar portion relative to the first planar portion should provide sufficient space between the motherboard and the second planar portion to allow for the maximum height of components on the motherboard and to provide sufficient clearance for components attached to the adjacent adapter card. With second planar portion 105 spaced apart from motherboard 202, air flow over the motherboard components (e.g., 204) is significantly improved over the prior art insulating techniques described above. The elimination of a separate insulator over the motherboard, as found in the prior art solutions, also reduces the overall cost of the system.

Tread 106 of card insulator 100 is also positioned parallel to and offset from motherboard 202 although, preferably, the tread is closer to the motherboard than is the second planar portion. Since adapter cards usually have conductive metal brackets attached to one edge of the card, riser 106a and tread 106b prevent the inadvertent shorting of the adapter card's metal bracket to the motherboard during installation of adapter card 205 into computer system 200. When a plurality of card insulators 100 are installed in adjacent positions in computer system 200, their respective second planar portions 105 form an almost continuous insulating plane over motherboard 202, thereby providing protection against inadvertent shorting that could result from small metal objects ( such as nuts, bolts, screwdrivers and pens) being accidentally dropped onto the motherboard.

We claim as our invention:

1. An information processing system, comprising:

a housing having first, second and third sides, said first and second sides being substantially perpendicular to said third side, said first side opposing said second side;

a motherboard coupled to said third side of said housing and having a first connector for receiving an adapter card;

a plurality of components coupled to said motherboard;

an adapter card having a second connector coupled to said first connector of said motherboard;

a card insulator having a first planar portion with opposing first and second edges; a second planar portion coupled to said first planar portion and extending substantially perpendicular to said first planar portion, said second planar portion having a slot through which said first and second connectors can be coupled together; a step having substantially perpendicular riser and tread portions, said riser portion being coupled to and extending substantially perpendicular to said second planar portion, said tread portion being positioned substantially parallel to and offset from said second planar portion; and first and second guides coupled, respectively, to said first and second sides of said housing; said first and second edges of said card insulator being positioned, respectively, in said first and second guides such that said first planar portion of said card insulator is positioned substantially perpendicular to said motherboard, and such that said second planar portion is positioned substantially parallel to said motherboard wherein said components are positioned between said second planar portion and said motherboard.

2. An information processing system, comprising:

a housing;

a motherboard coupled to said housing and having a first connector for receiving an adapter card;

a plurality of components coupled to said motherboard;

an adapter card having a second connector coupled to said first connector of said motherboard;

a card insulator having a first planar portion, and a second planar portion coupled to said first planar portion and extending substantially perpendicular to said first planar portion, said second planar portion having a slot through which said first and second connectors can be coupled together; and means for supporting said card insulator such that said first planar portion of said card insulator is positioned substantially perpendicular to said motherboard, and such that said second planar portion is positioned substantially parallel to said motherboard, thereby positioning said components between said second planar portion and said motherboard.

3. The information processing system of claim 2, further comprising:

a step having substantially perpendicular riser and tread portions, said riser portion being coupled to and extending substantially perpendicular to said second planar portion, said tread portion being positioned substantially parallel to and offset from said second planar portion.

4. A card insulator for use with an information processing system comprising a motherboard having a first connector for receiving an adapter card; a plurality of components coupled to the motherboard; and an adapter card having a second connector coupled to the first connector of the motherboard; said card insulator comprising:

a first planar portion; and a second planar portion coupled to said first planar portion and extending substantially perpendicular to said first planar portion, said second planar portion having a slot through which the first and second connectors can be coupled together;

such that, when said card insulator is installed in the information processing system, said first planar portion of said card insulator is positioned substantially perpendicular to the motherboard, said second planar portion is positioned substantially parallel to the motherboard, and the components are positioned between said second planar portion and the motherboard.

5. The card insulator of claim 4, further comprising:

a step having substantially perpendicular riser and tread portions, said riser portion being coupled to and extending substantially perpendicular to said second planar portion, said tread portion being positioned substantially parallel to and offset from said second planar portion.

* * * * *